(12) United States Patent
Kakui et al.

(10) Patent No.: US 8,902,940 B2
(45) Date of Patent: Dec. 2, 2014

(54) LIGHT SOURCE CONTROL METHOD

(75) Inventors: Motoki Kakui, Yokohama (JP); Shinobu Tamaoki, Yokohama (JP)

(73) Assignee: Megaopto Co., Ltd., Wako-shi (JP)

(*) Notice: Subject to any disclaimer, the term of this patent is extended or adjusted under 35 U.S.C. 154(b) by 0 days.

(21) Appl. No.: 13/477,536

(22) Filed: May 22, 2012

(65) Prior Publication Data

US 2012/0300802 A1    Nov. 29, 2012

Related U.S. Application Data

(60) Provisional application No. 61/503,153, filed on Jun. 30, 2011.

(30) Foreign Application Priority Data

May 24, 2011  (JP) ................ P2011-115979

(51) Int. Cl.
| | |
|---|---|
| H01S 3/10 | (2006.01) |
| H01S 3/067 | (2006.01) |
| B23K 26/06 | (2014.01) |
| H01S 3/094 | (2006.01) |
| H01S 3/16 | (2006.01) |
| H01S 5/068 | (2006.01) |
| H01S 3/00 | (2006.01) |
| H01S 5/062 | (2006.01) |
| H01S 3/17 | (2006.01) |

(52) U.S. Cl.
CPC ......... H01S 3/06758 (2013.01); H01S 3/10015 (2013.01); *H01S 3/094003* (2013.01); *H01S 3/1693* (2013.01); *H01S 5/06804* (2013.01); *H01S 3/1618* (2013.01); *H01S 3/0078* (2013.01); *H01S 5/06216* (2013.01); *H01S 3/094061* (2013.01); B23K 26/063 (2013.01); *H01S 3/176* (2013.01); *H01S 3/0064* (2013.01)

USPC .............................................. 372/25; 372/31

(58) Field of Classification Search
CPC .... B23K 26/063; H01S 3/10015; H01S 3/131
USPC .............. 372/36, 31, 30, 25, 29.02
See application file for complete search history.

(56) References Cited

U.S. PATENT DOCUMENTS 5,943,349 A    8/1999  Ohta
(Continued)

FOREIGN PATENT DOCUMENTS

| JP | 2009-152560 | 7/2009 |
| JP | 2010-226096 | 10/2010 |
| JP | 2011-243832 | 12/2011 |

OTHER PUBLICATIONS

International Preliminary Report on Patentability in PCT International Application No. PCT/JP2012/062684, dated Nov. 28, 2013.
"Generation and Control of Ultrashort Light Pulse", Maruzen Co., Ltd., pp. 17-31, Mar. 15, 1990.

(Continued)

*Primary Examiner* — Tuan Nguyen
(74) *Attorney, Agent, or Firm* — Venable LLP; Michael A. Sartori; Tamatane J. Aga

(57) ABSTRACT

The present invention relates to a light source control method capable of decreasing the dependence of a pulse width (FWHM) of an output pulsed light on a repetition frequency. A pulsed light source has an MOPA structure, and has a seed light source and an optical fiber amplifier. The seed light source includes a semiconductor laser which is directly modulated and outputs a pulsed light. By adjusting a temperature of the seed light source and a pumping light power of the optical fiber amplifier, a predetermined full width half maximum of a pulse at a predetermined repetition frequency is implemented for the pulsed light outputted from the optical fiber amplifier.

9 Claims, 19 Drawing Sheets

(56) References Cited

U.S. PATENT DOCUMENTS

| | | | |
|---|---|---|---|
| 6,819,688 B2* | 11/2004 | Sakai et al. | 372/6 |
| 7,538,936 B2 | 5/2009 | Yokoyama | |
| 8,023,537 B2 | 9/2011 | Inoue | |
| 8,290,003 B2* | 10/2012 | Kakui | 372/6 |
| 2002/0009105 A1* | 1/2002 | Matsumoto | 372/34 |
| 2002/0041618 A1 | 4/2002 | Watanabe et al. | |
| 2002/0044342 A1 | 4/2002 | Krummrich | |
| 2003/0043451 A1 | 3/2003 | Kato et al. | |
| 2004/0095635 A1 | 5/2004 | Kakui | |
| 2006/0257150 A1 | 11/2006 | Tsuchiya et al. | |
| 2007/0041083 A1 | 2/2007 | Di Teodoro et al. | |
| 2007/0268570 A1 | 11/2007 | Kakui | |
| 2009/0141751 A1* | 6/2009 | Kakui | 372/25 |

OTHER PUBLICATIONS

Motoki Kakui, et al., "2.5-Gbit/s Repeaterless Transmission Systems over Non-Dispersion-Shifted Fiber Using Directly Modulated DFB Laser and Dispersion Compensating Fiber", Optical Fiber Technology 1, pp. 312-317, 1995.

F.D. Teodoro et al., "High-power Pulsed Fiber Source at 1567 nm", PhotonicWest, 2005.

J. Limpert et al., "All Fiber Chirped-Pulse Amplification System Based on Compression in Air-Guiding Photonic Bandgap Fiber", Optics Express, vol. 11, No. 24, pp. 3332-3337, Dec. 1, 2003.

United States Office Action issued in U.S. Appl. No. 12/277,897 dated Jul. 10, 2012.

United States Office Action issued in U.S. Appl. No. 12/277,897 dated Aug. 12, 2011.

* cited by examiner

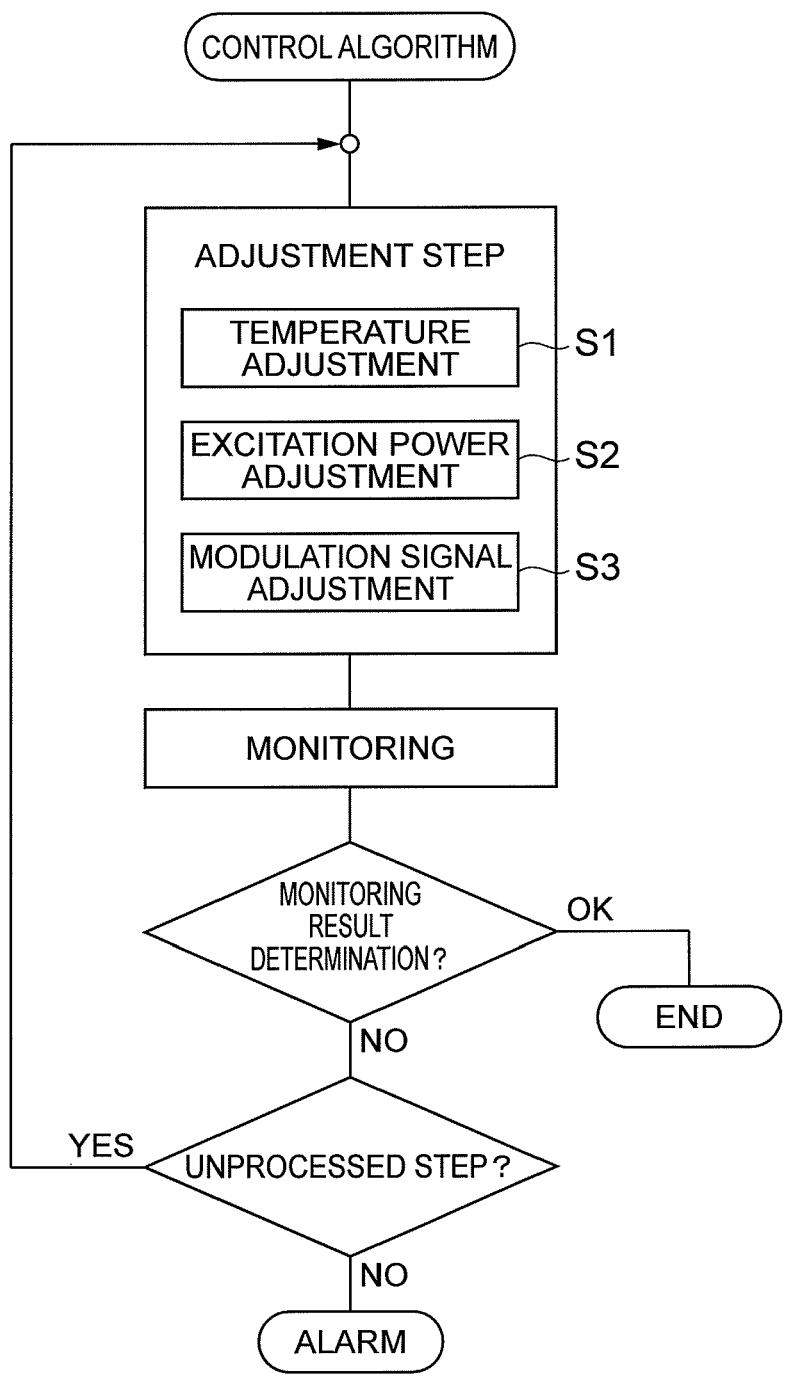

LIGHT SOURCE CONTROL METHOD

CROSS-REFERENCE TO RELATED APPLICATION

This application is based upon and claims the benefit of priorities from U.S. Provisional Application No. 61/503,153, filed on Jun. 30, 2011 and Japanese Patent Application No. 2011-115979, filed on May 24, 2011, the entire contents of which are incorporated herein by reference.

BACKGROUND OF THE INVENTION

1. Field of the Invention

The present invention relates to a method of controlling a pulsed light source that amplifies pulsed light outputted from a directly modulated semiconductor laser by an optical fiber amplifier, and repeatedly outputs the amplified pulsed light.

2. Related Background Art

A pulsed light source is used for industrial applications represented by laser processing. Generally for processing micro-objects by laser, it is critical to control a pulse width of a pulsed laser beam to be constant, in order to manage processing quality, including a thermal effect on surroundings. On the other hand, throughput or the like demanded for each processing object varies, and a repetition frequency of the pulsed light output must be optimized according to the application. Control of a pulse width is important not only for micro-processing, but also for optical measurement, communication and medical application fields. Japanese Patent Application Laid-Open No. 2009-152560 (Patent Document 1) discloses an invention to compress a pulse width of an output pulsed light.

SUMMARY OF THE INVENTION

The present inventors have examined the above conventional pulse width control of the pulsed light source, and as a result, have discovered the following problems. That is, the pulsed light source disclosed in Patent Document 1 is effective for compressing a pulse width of an output pulsed light. However, as FIG. 13 in Patent Document 1 shows, the pulse width increases if the repetition frequency of the pulsed light output is low, because of the transient response of an optical fiber amplifier. In other words, according to Patent Document 1, a full width half maximum of a pulse (hereafter "FWHM of a pulse", or simply "pulse width" or "FWHM") is 0.56 ns if the repetition frequency is 100 kHz, while FWHM is 0.41 ns if the repetition frequency is 2.5 MHz.

The present invention has been developed to eliminate the problems described above. It is an object of the present invention to provide a light source control method which allows decreasing the dependency of the pulse width (FWHM) of an output pulsed light on the repetition frequency.

A light source control method according to the present invention provides a pulsed light source which comprises a directly modulated semiconductor laser as a seed light source, and decreases the dependency of a pulse width of an output pulsed light on a repetition frequency. In concrete terms, the pulsed light source comprises a semiconductor laser, an optical filter, and an optical fiber amplifier, and has an MOPA (Master Oscillator Power Amplifier) structure. The semiconductor laser is directly modulated and outputs a pulsed light. The optical filter inputs the pulsed light outputted from the semiconductor laser, and outputs a shaped-pulsed light in which one of a shorter wavelength side and a longer wavelength side from a peak wavelength of the input pulsed light, out of the wavelength bands of the input pulsed light, is attenuated more than the other. The optical fiber amplifier amplifies the shaped-pulsed light outputted from the optical filter, and outputs the amplified pulsed light. In the light source control method, as a first aspect, a temperature of the semiconductor laser is adjusted so as to implement a predetermined full width half maximum (FWHM) of pulse at a predetermined repetition frequency, for the amplified pulsed light outputted from the optical fiber amplifier. In the light source control method, as a second aspect applicable to the first aspect, the pumping light power of the optical fiber amplifier is controlled so as to implement a predetermined FWHM of a pulse at a predetermined repetition frequency for the amplifier pulsed light outputted from the optical fiber amplifier. As third to a fifth aspects applicable to at least one of the first and second aspects, a predetermined FWHM of a pulse is less than 1 ns, or less than 500 ps more preferably, or less than 300 ps even more preferably. As a sixth aspect applicable to at least one of the first and second aspects, the predetermined repetition frequency is 600 kHz or less.

As a seventh aspect applicable to at least one of the first and second aspects, a relationship among the temperature of the semiconductor laser, the repetition frequency and the FWHM of a pulse is determined in advance. Such a relationship can be implemented by creating a table of measured values of the temperature of the semiconductor laser, the repetition frequency and the FWHM of a pulse obtained in advance, and storing this measured value table in memory. In the seventh aspect, it is preferable that the temperature of the semiconductor laser is adjusted by feed-forward control based on this relationship (measured values associated by the table stored in memory in advance), so as to implement the predetermined FWHM of a pulse at the predetermined repetition frequency for the amplified pulsed light outputted from the optical fiber amplifier.

As an eighth aspect applicable to at least one of the first and second aspects, the FWHM of the amplified pulsed light outputted from the optical fiber amplifier is monitored, and the temperature of the semiconductor laser is adjusted by feedback control based on this result of monitoring the FWHM, so as to implement the predetermined FWHM of a pulse at the predetermined repetition frequency for the amplified pulsed light outputted from the optical fiber amplifier. In particular, as a ninth aspect applicable to the eighth aspect, it is preferable that the temperature of the semiconductor laser is increased when the result of monitoring the FWHM shows that the FWHM is wider than the predetermined FWHM of a pulse, and the temperature of the semiconductor laser is decreased when the result of monitoring the FWHM shows that the FWHM is narrower than the predetermined FWHM of a pulse.

BRIEF DESCRIPTION OF THE DRAWINGS

FIG. 19 is a flow chart for explaining an algorithm to control FWHM of the output pulsed light.

DESCRIPTION OF THE PREFERRED EMBODIMENTS

In the following, embodiments of the present invention will now be described with reference to the attached drawings. In the description of the drawings, a same composing element is denoted with a same reference symbol, for which redundant description is omitted.

Figure 1:
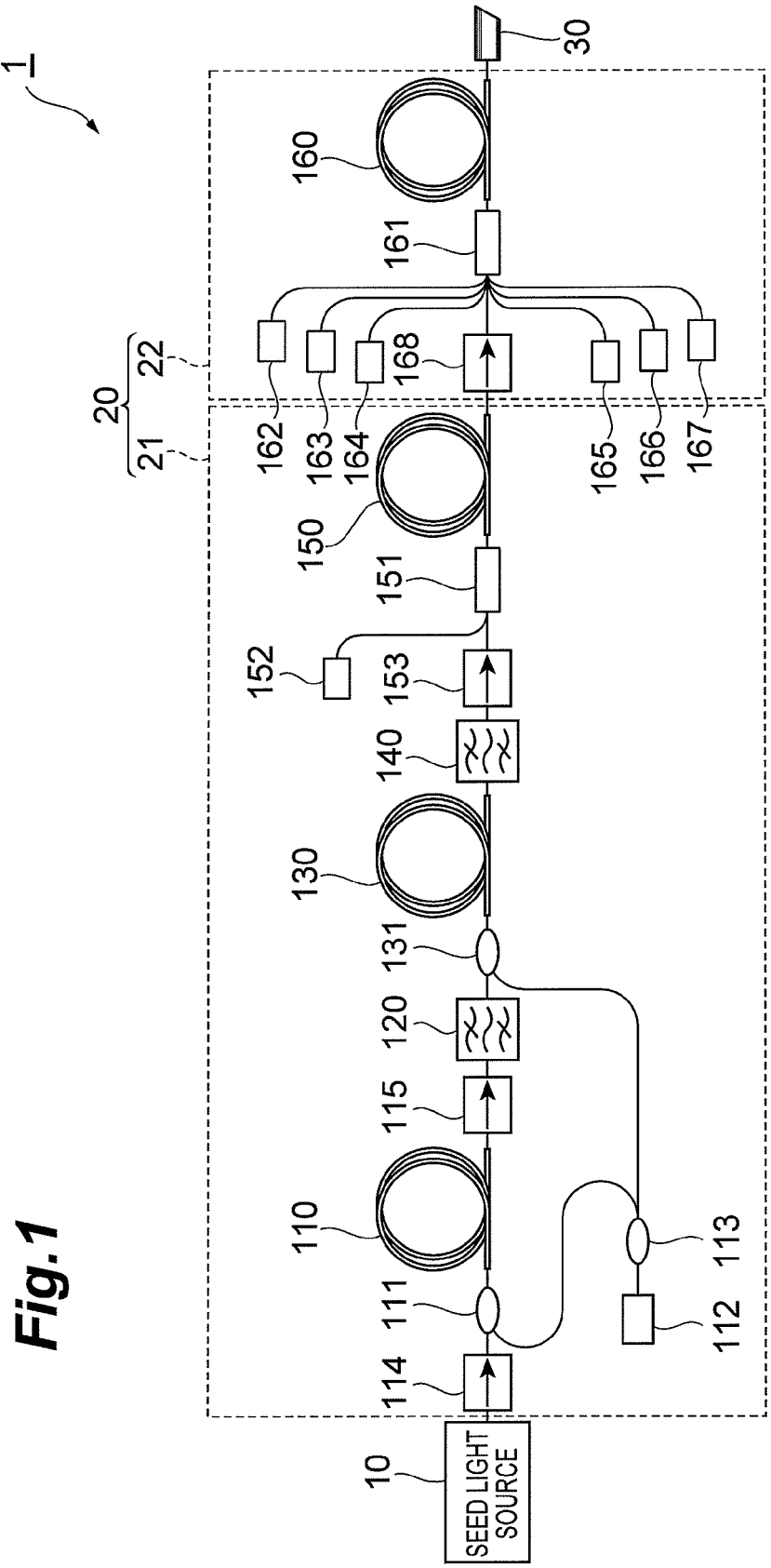
FIG. 1 is a view showing a configuration of an embodiment of a pulsed light source according to the present invention.

FIG. 1 is a view showing a configuration of an embodiment of a pulsed light source according to the present invention. In FIG. 1, the pulsed light source 1 has a MOPA structure and comprises a seed light source 10 and an optical fiber amplifier 20. The seed light source 10 includes a 1060 nm band Fabry-Perot semiconductor laser that is directly pulse-modulated in the range of drive current 0 to 220 mA, so as to implement a high repetition frequency that reaches 100 kHz to 1 MHz and a constant pulse width without depending on the repetition frequency.

The optical fiber amplifier 20 includes a preamplifier 21 and a booster amplifier 22. The preamplifier 21 includes, for example, a YbDF 110, a bandpass filter 120, a YbDF 130, a bandpass filter 140 and a YbDF 150. The booster amplifier 22 includes, for example, a YbDF 160. The preamplifier 21 and the booster amplifier 22 are optical fiber amplifiers, each of which amplifies a pulse light repeatedly outputted from the seed light source 10, and outputs the amplified-pulsed light from an end cap 30. This pulsed light source 1 outputs a pulsed light of which wavelength is around 1060 nm, which is ideal for laser processing.

Each of the YbDFs 110, 130, 150 and 160 is an optical amplification media which amplifies a pulsed light having a wavelength near 1060 nm and outputted from the seed light source 10, and in which a core of an optical fiber composed of silica glass is doped with Yb element as an activating material. Each of the YbDFs 110, 130, 150 and 160 is advantageous in terms of power conversion efficiency, since the pumping light wavelength and an amplified light wavelength are close to each other, and is also advantageous in terms of having a high gain at around wavelength 1060 nm. These YbDFs 110, 130, 150 and 160 constitute a four-stage optical fiber amplifier.

The pumping light from a pumping light source 112 is supplied to the YbDF 110 in the first stage in the forward direction through an optical coupler 113 and an optical coupler 111. The YbDF 110 amplifies the pulsed light from the seed light source 10 through the optical isolator 114 and the optical coupler 111, and outputs the amplified-pulsed light via an optical isolator 115.

The bandpass filter 120 inputs the amplified-pulsed light from the YbDF 110 in the first stage through the optical isolator 115, and outputs a shaped-pulsed light in which one of a shorter wavelength side and a longer wavelength side of the input pulsed light, out of the wavelength bands of the input pulsed light, is attenuated more than the other.

The pumping light from the pumping light source 112 is supplied to the YbDF 130 in the second stage in the forward direction via the optical coupler 113 and an optical coupler 131. The YbDF 130 amplifies the pulsed light from the bandpass filter 120 through the optical coupler 131, and outputs the amplified-pulsed light.

The bandpass filter 140 inputs the amplified-pulsed light from the YbDF 130 in the second stage, and outputs a shaped-pulsed light in which one of a shorter wavelength side and a longer wavelength side of the input pulsed light, out of the wavelength bands of the input pulsed light, is attenuated more than the other.

The pumping light from a pumping light source 152 is supplied to the YbDF 150 in the third stage in the forward direction via an optical coupler 151. The YbDF 150 amplifies the pulsed light from the bandpass filter 140 through an optical isolator 153 and the optical coupler 151, and outputs the amplified-pulsed light.

The pumping light from the pumping light sources 162 to 167 is supplied to the YbDF 160 in the fourth stage in the forward direction through an optical combiner 161 respectively. The YbDF 160 further amplifies the pulsed light from the YbDF 150 in the third stage through an optical isolator 168 and the optical combiner 161, and outputs the amplified-pulsed light to outside the pulsed light source 1 via the end cap 30.

A preferred configuration example is as follows. Each of YbDF 110, 120 and 130 is an Al co-doped silica-based YbDF in a single cladding structure, with Al concentration of 5 wt %, a core diameter of 7 μm, a cladding diameter of 125 μm, a 915 nm band pumping light unsaturated absorption of 70 dB/m, a 975 nm band pumping light unsaturated absorption peak of 240 dB/m and the length of 7 m. The YbDF 160 in the fourth stage is an Al co-doped silica-based YbDF having a double cladding structure, with the Al concentration of 1 wt %, a core diameter of 10 μm, a cladding diameter of 125 μm, a 915 nm band pumping light unsaturated absorption of 1.5 dB/m and its length of 3.5 m.

All the wavelengths of the pumping light supplied to the YbDFs 110, 130, 150 and 160 are in a 0.98 μm band. The pumping light supplied to the YbDF 110 in the first stage has 200 mW power, and has a single mode. The pumping light supplied to the YbDF 130 in the second stage has 200 mW power, and has a single mode. The pumping light supplied to the YbDF 150 in the third stage has 400 mW power, and has a single mode. The pumping light supplied to the YbDF 160 in the fourth stage has 12 to 24 W power, and has multi-mode. Hereafter the pumping light power is indicated as a relative ratio, regarding the case of the 24 W power of the pumping light supplied to the YbDF 160 in the fourth stage as 100%.

By shifting the respective central wavelengths of the bandpass filters 120 and 140 to the shorter wavelength side or to the longer wavelength side from the maximum intensity wavelength of the output light spectrum of the seed light source 10, only the chirping components can be extracted from the seed lights outputted from the seed light source 10. Then pulsed light with a short pulse width can be generated by amplifying this light thereafter. Each of the bandpass filters 120 and 140 can remove ASE light. FWHM of the transmission spectrum of each of the bandpass filters 120 and 140 is maintained at 1 ns or less, for example, respectively.

FIGS. 2 to 13 are views showing the pulse waveforms of the output pulsed lights from the pulsed light source 1. In FIGS. 2 to 13, a total of 12 graphs of G210, G310, G410, G510, G610, G710, G810, G910, G1010, G1110, G1210 and G1310 show a pulse waveform of an output pulsed light when the pumping light power of the YbDF 160 in the fourth stage is 30%. A total of 10 graphs of G220, G320, G420, G620, G720, G820, G920, G1020, G1120 and G1220 show a pulse waveform of an output pulsed light when the pumping light power of the YbDF 160 in the fourth stage is 50%. A total of 11 graphs of G230, G330, G430, G530, G630, G730, G830, G1030, G1130, G1230 and G1330 shows a pulse waveform of an output pulsed light when the pumping light power of the YbDF 160 in the fourth stage is 70%. A total of 12 graphs of G240, G340, G440, G540, G640, G740, G840, G940, G1040, G1140, G1240 and G1340 show a pulse waveform of an output pulsed light when the pumping light power of the YbDF 160 in the fourth stage is 100%.

Figure 2:
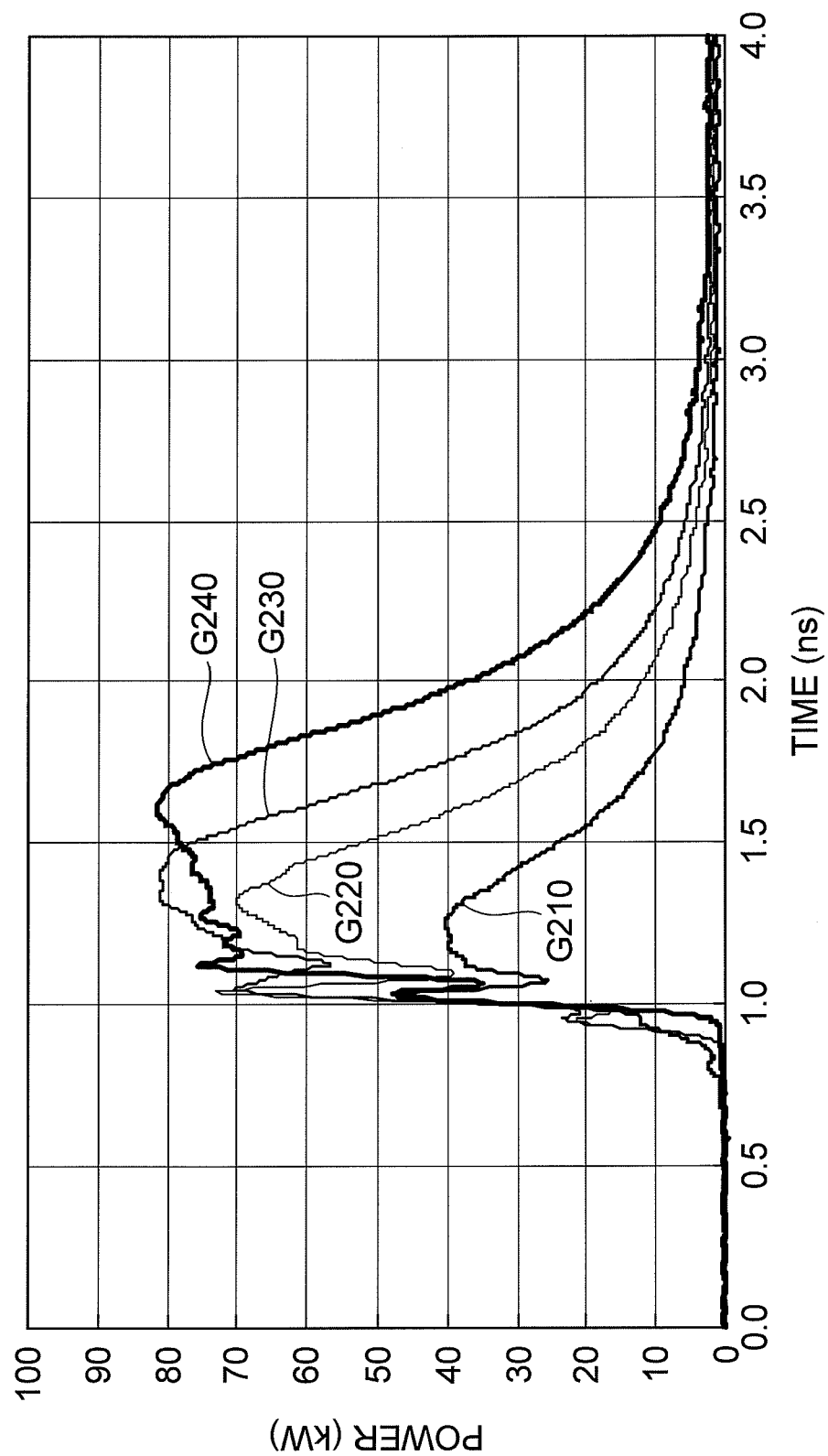
FIG. 2 is a view showing pulse waveforms of output pulsed lights (amplified pulsed lights) from the pulsed light source in FIG. 1.
Figure 3:
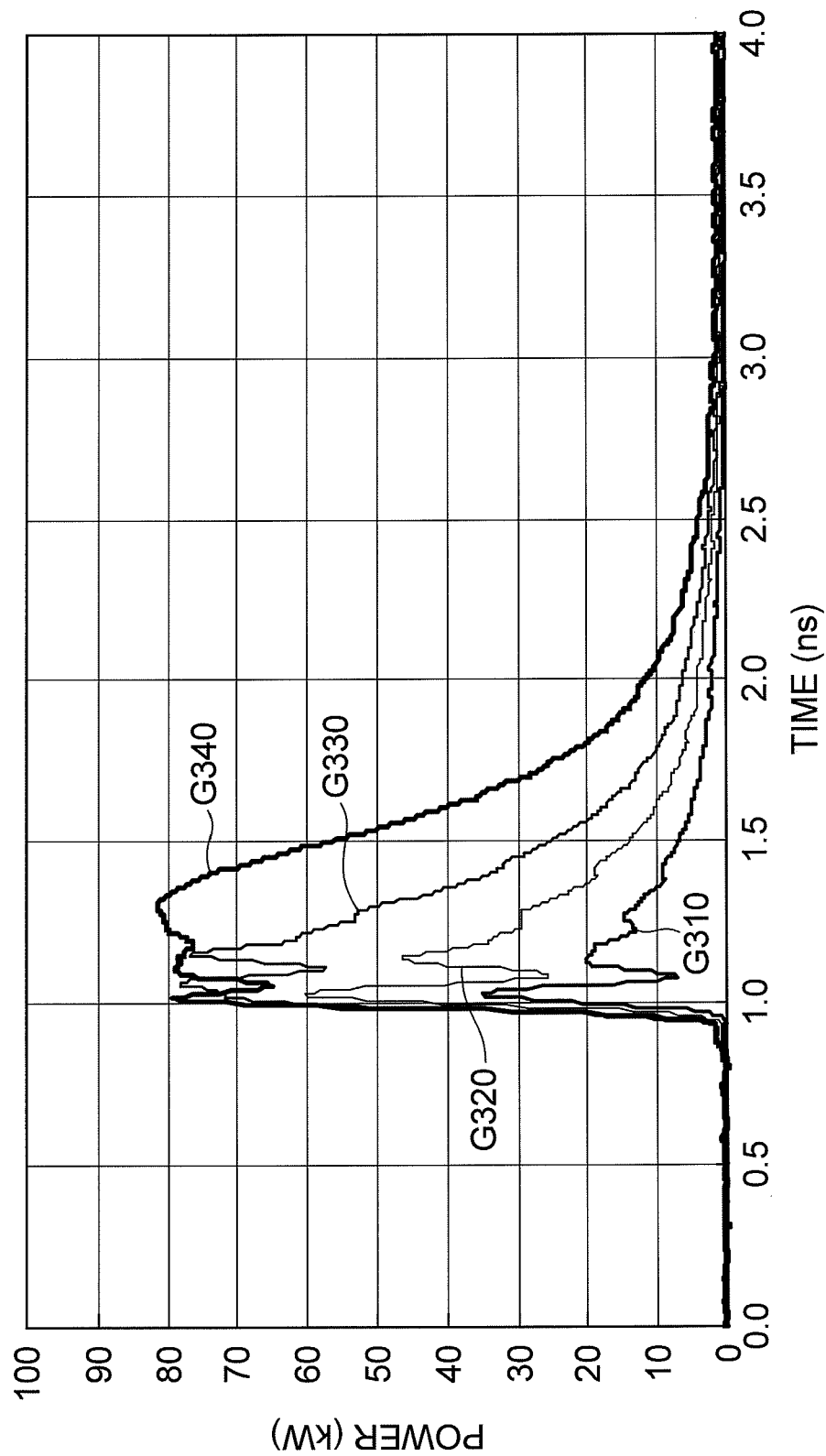
FIG. 3 is a view showing pulse waveforms of output pulsed lights from the pulsed light source in FIG. 1.
Figure 4:
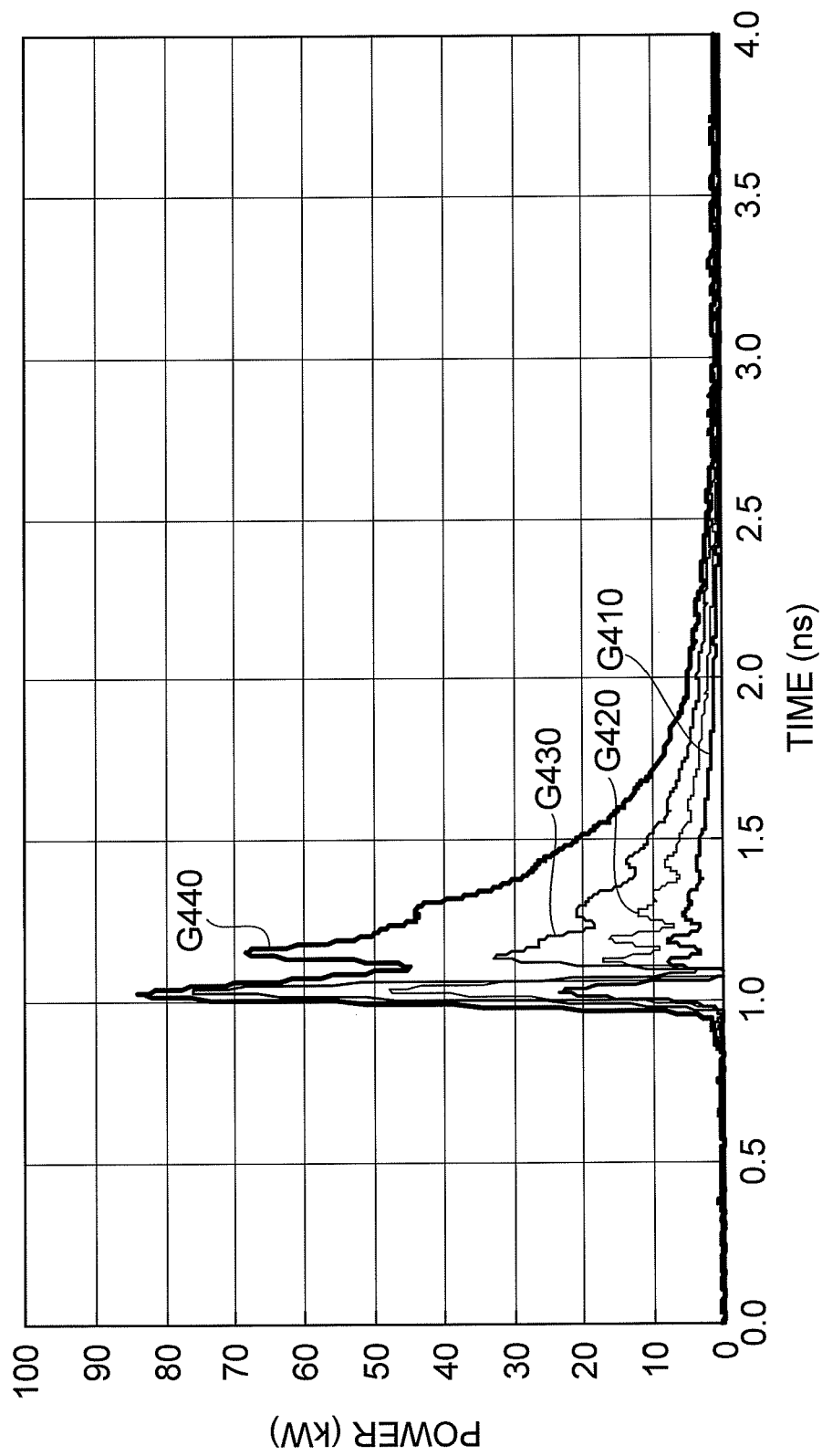
FIG. 4 is a view showing pulse waveforms of output pulsed lights from the pulsed light source in FIG. 1.
Figure 5:
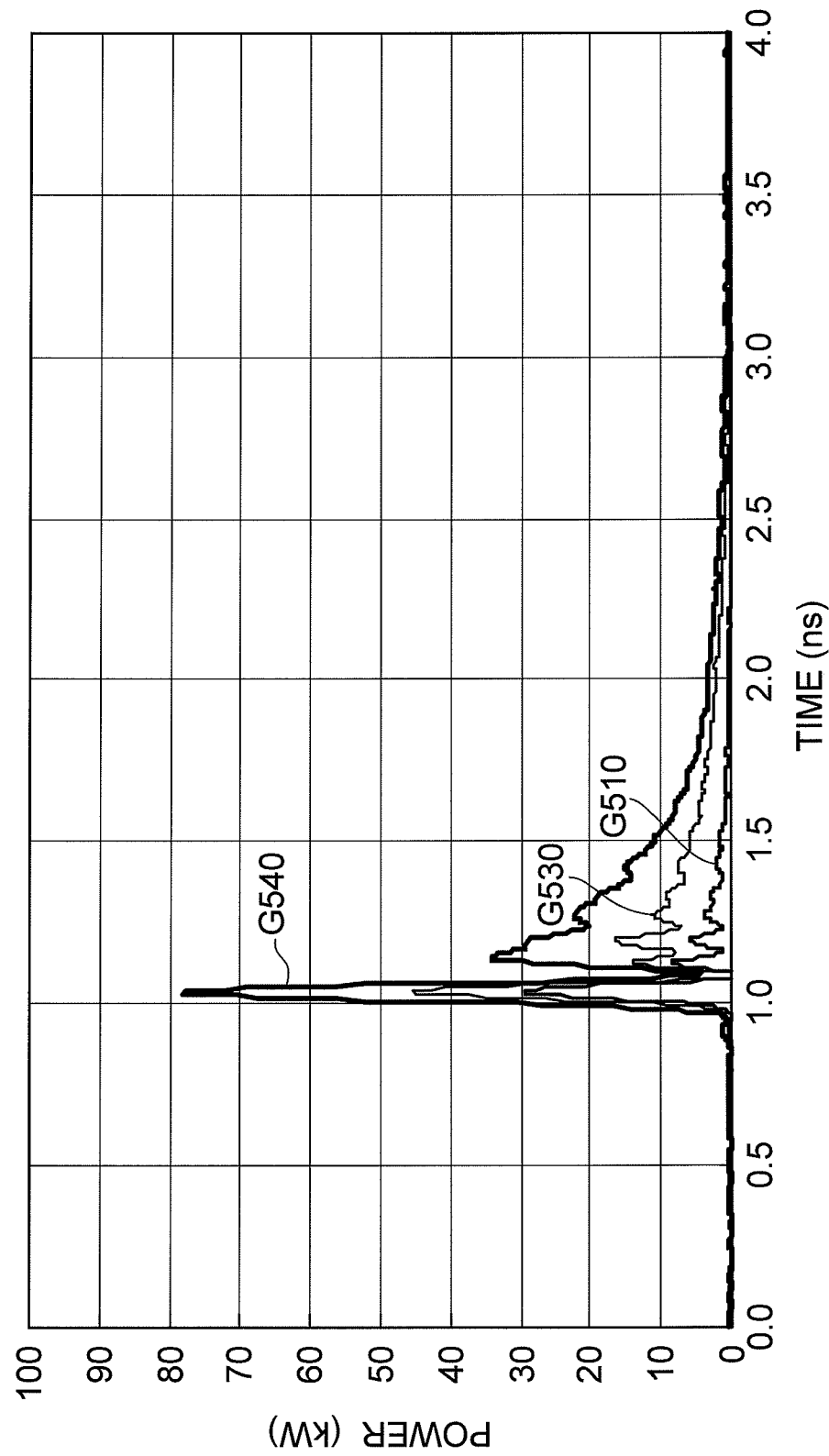
FIG. 5 is a view showing pulse waveforms of output pulsed lights from the pulsed light source in FIG. 1.

FIGS. 2 to 5 show the pulse waveforms of output pulsed lights when the temperature of the seed light source 10 is set to 17° C. FIG. 2 shows pulse waveforms (graphs G210 to G240) when the repetition frequency is 100 kHz, FIG. 3 shows pulse waveforms (graphs G310 to G340) when the repetition frequency is 300 kHz, FIG. 4 shows pulse waveforms (graphs G410 to G440) when the repetition frequency is 600 kHz, and FIG. 5 shows pulse waveforms (graphs G510 and G530 to G540) when the repetition frequency is 1000 kHz.

Figure 6:
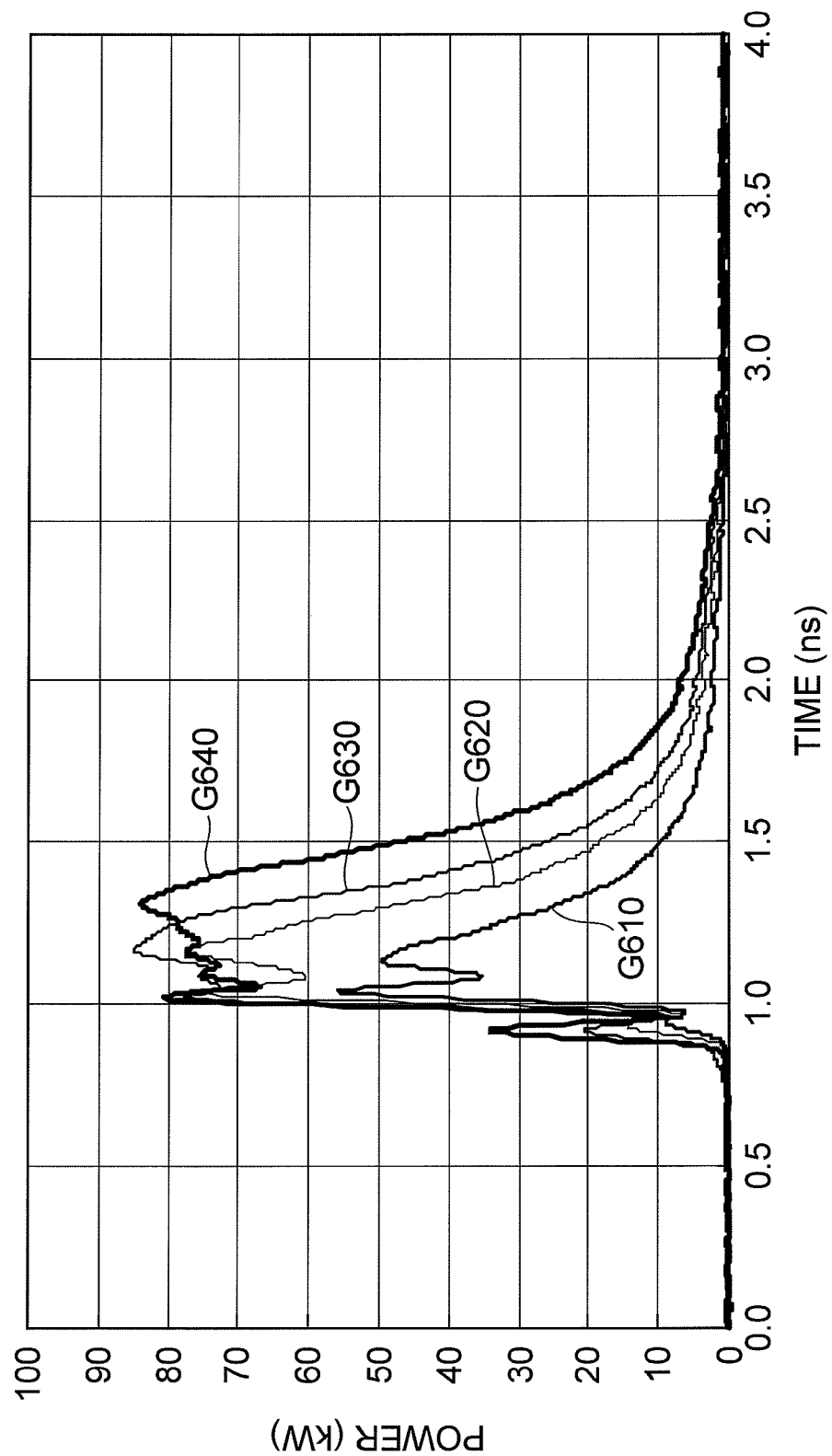
FIG. 6 is a view showing pulse waveforms of output pulsed lights from the pulsed light source in FIG. 1.
Figure 7:
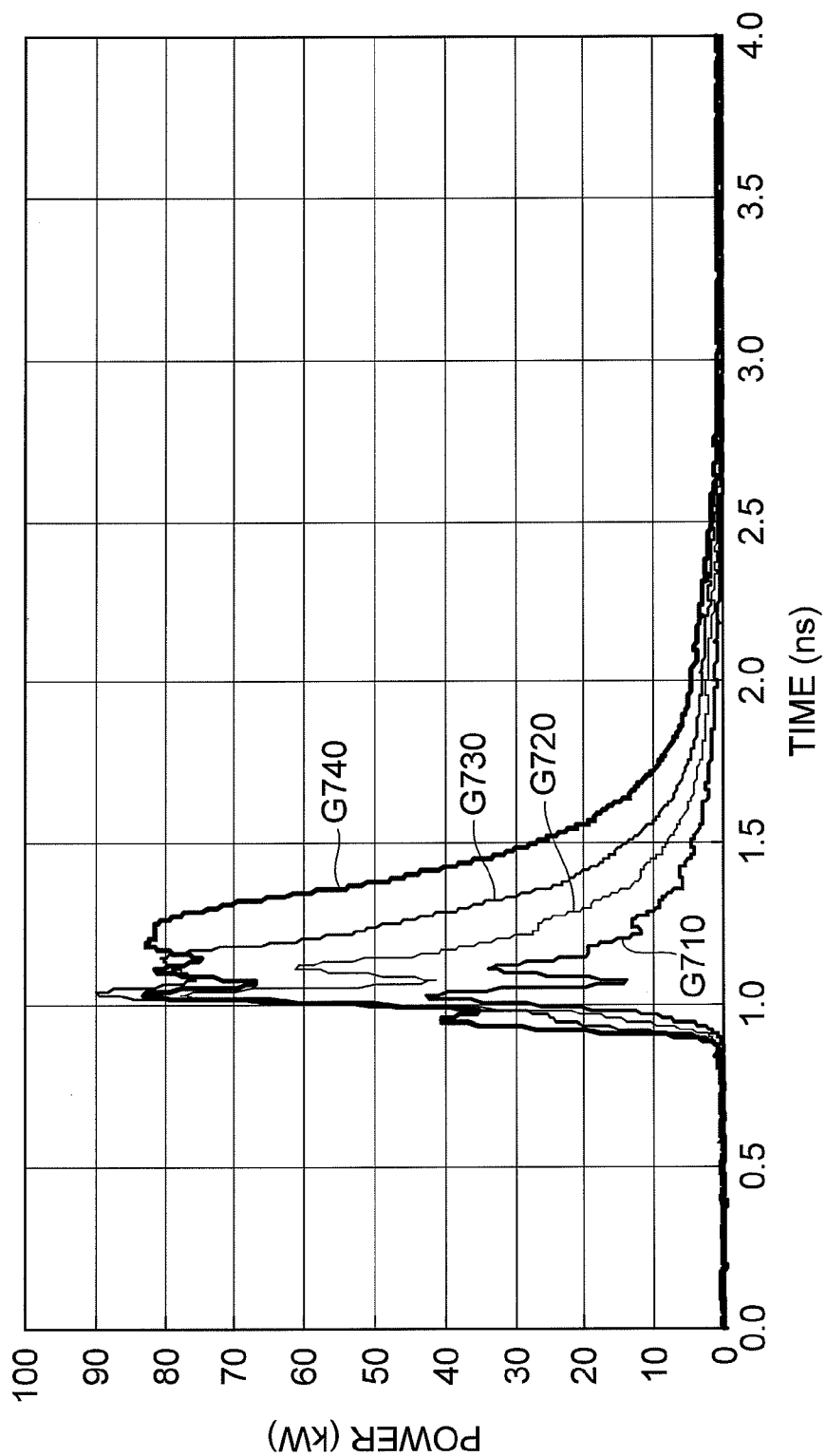
FIG. 7 is a view showing pulse waveforms of output pulsed lights from the pulsed light source in FIG. 1.
Figure 8:
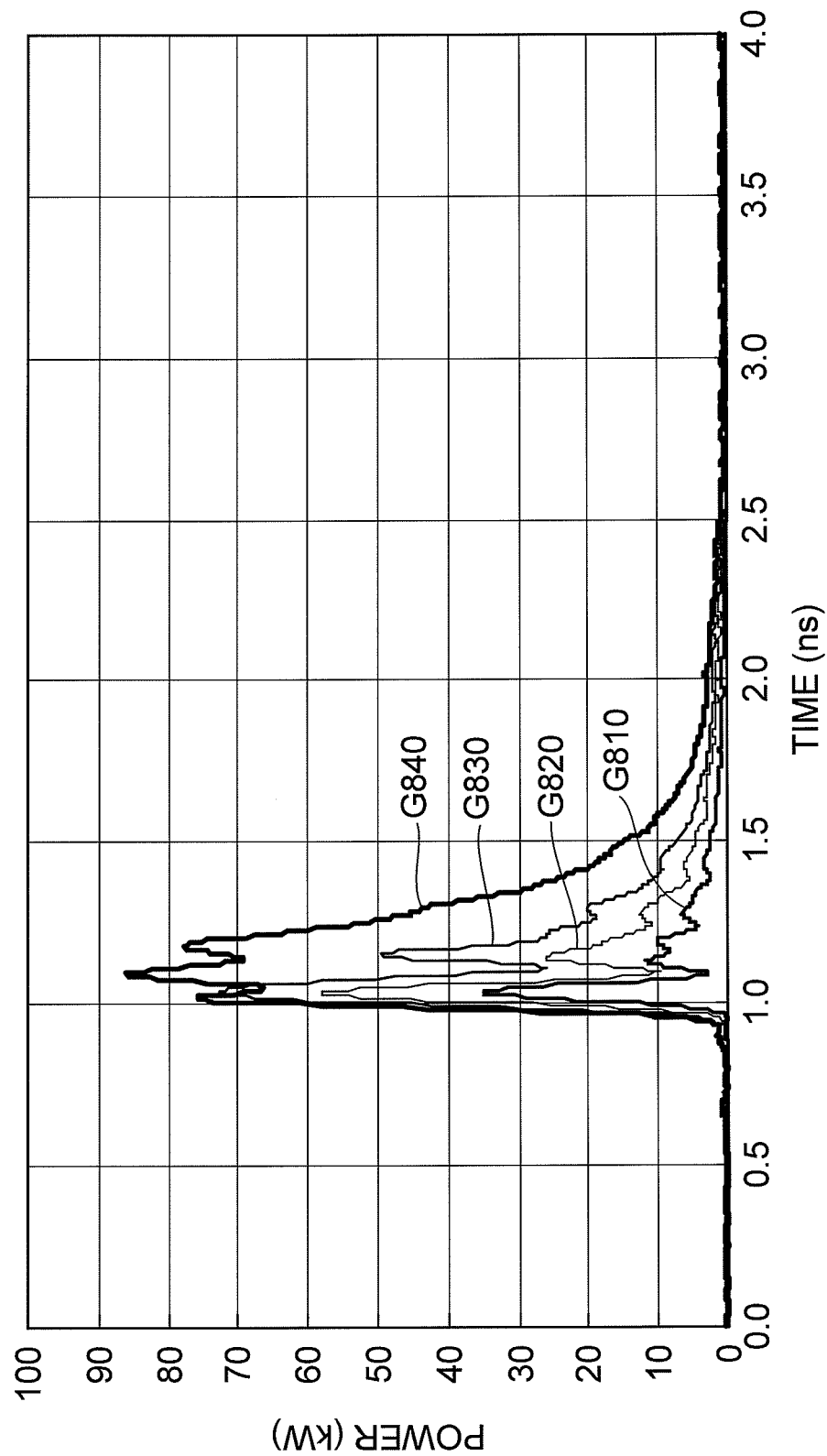
FIG. 8 is a view showing pulse waveforms of output pulsed lights from the pulsed light source in FIG. 1.
Figure 9:
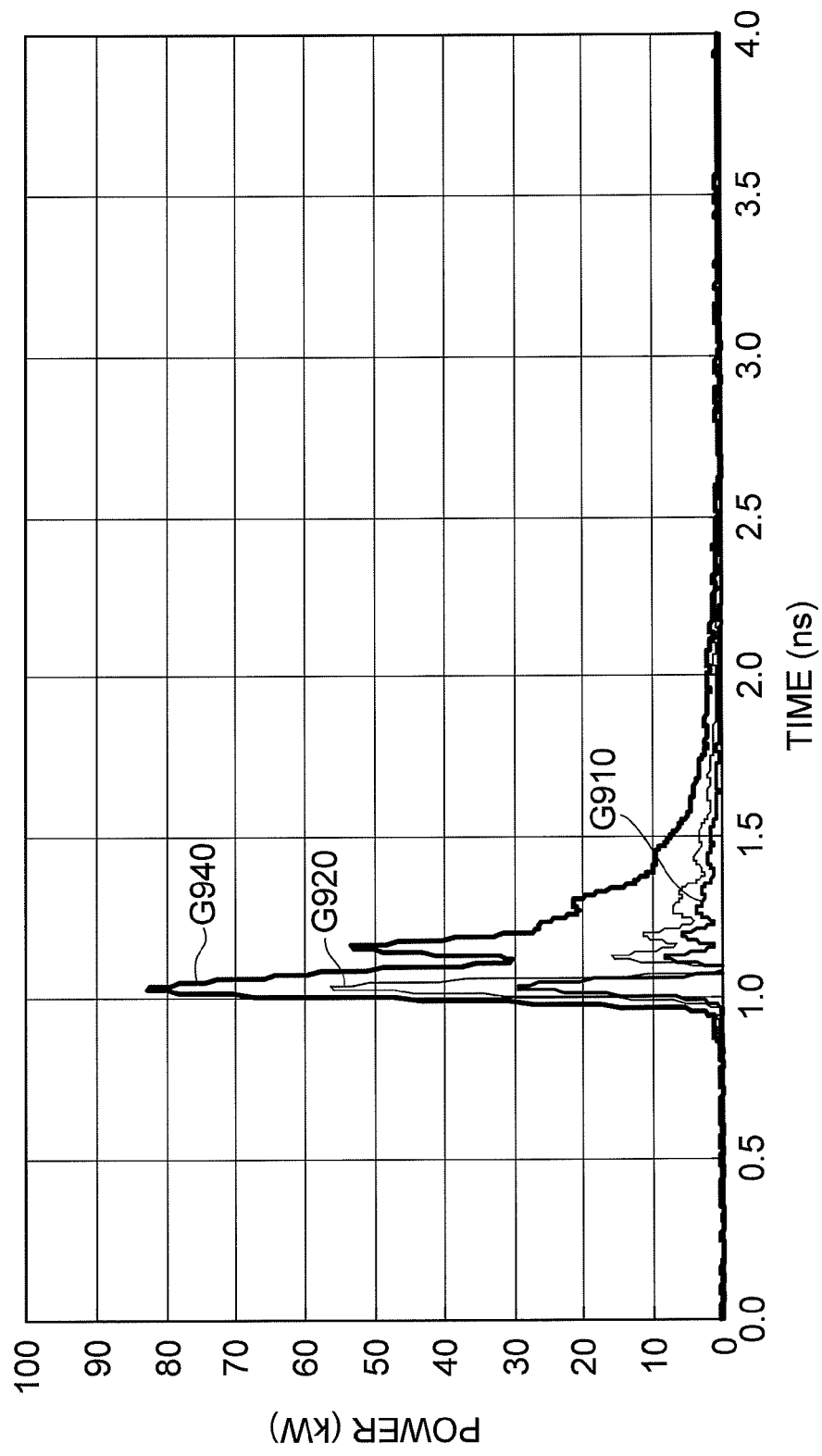
FIG. 9 is a view showing pulse waveforms of output pulsed lights from the pulsed light source in FIG. 1.

FIGS. 6 to 9 show the pulse waveforms of output pulsed lights when the temperature of the seed light source 10 is set to 27° C. FIG. 6 shows pulsed waveforms (graphs G610 to G640) when the cycle frequency is 100 kHZ, FIG. 7 shows pulse waveforms (graphs G710 to G740) when the repetition frequency is 300 kHz, FIG. 8 shows pulse waveforms (graphs G810 to G840) when the repetition frequency is 600 kHz, and FIG. 9 shows pulse waveforms (graphs G910, G920 and G940) when the repetition frequency is 1000 kHz.

Figure 10:
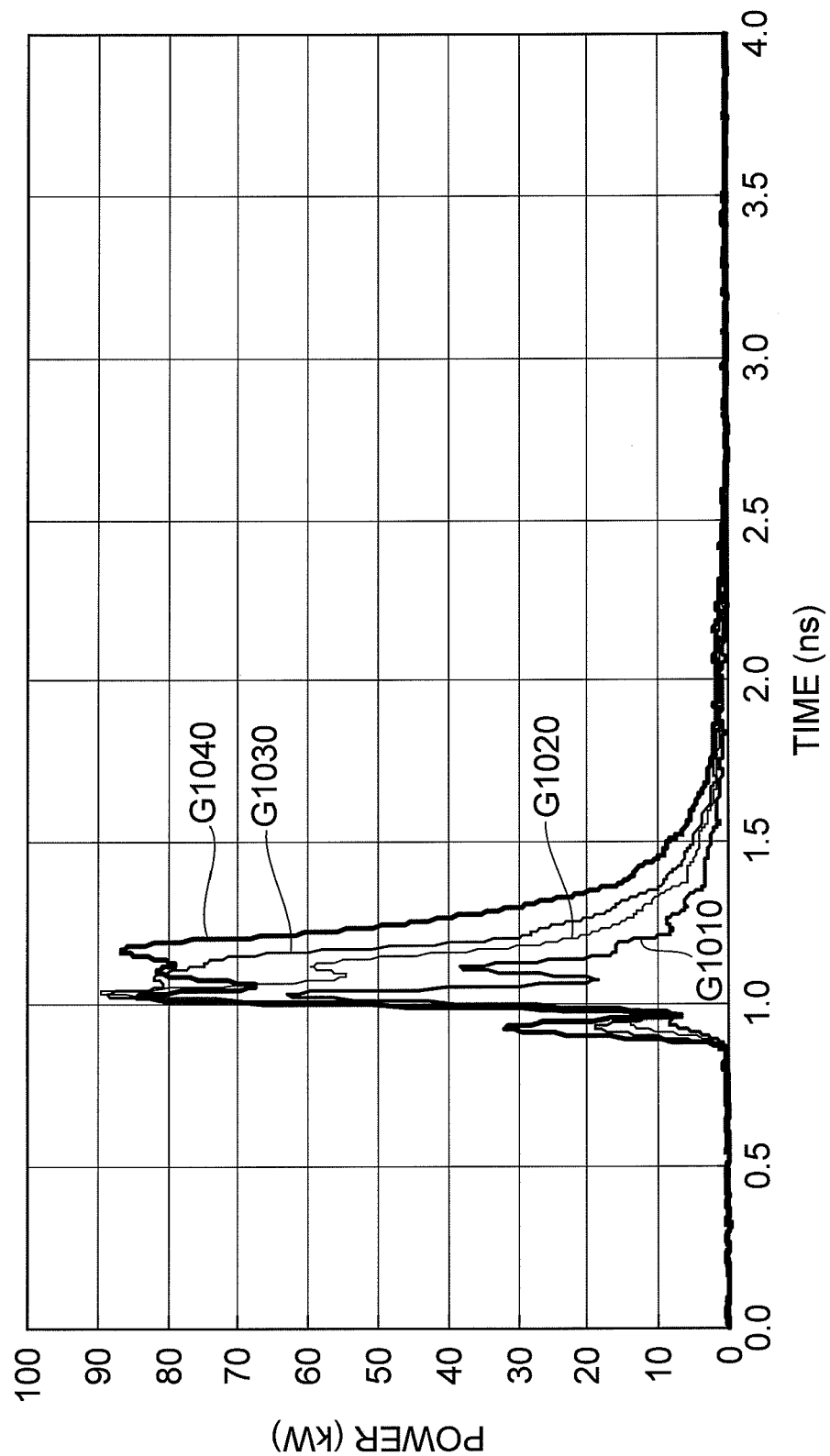
FIG. 10 is a view showing pulse waveforms of output pulsed lights from the pulsed light source in FIG. 1.
Figure 11:
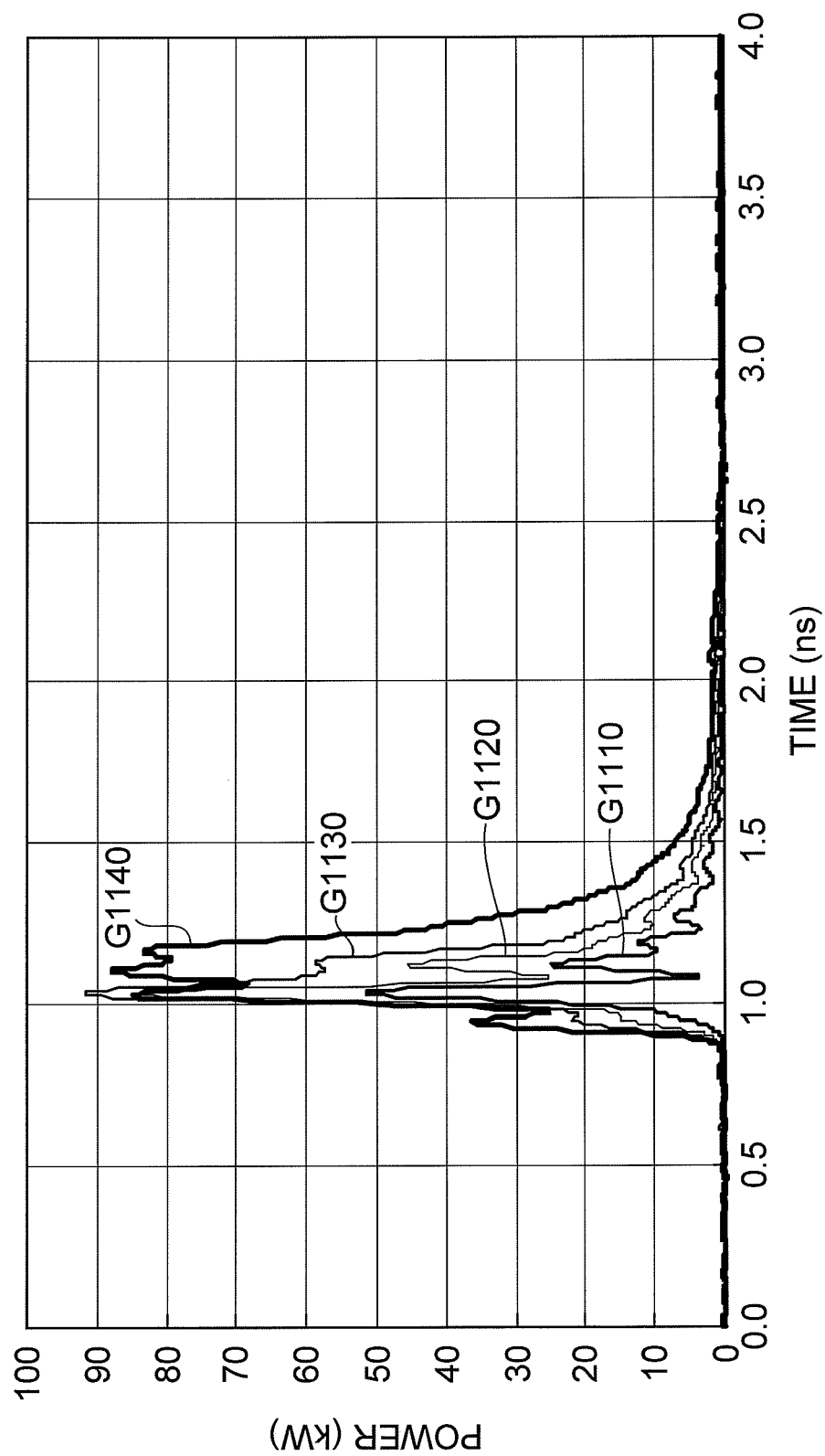
FIG. 11 is a view showing pulse waveforms of output pulsed lights from the pulsed light source in FIG. 1.
Figure 12:
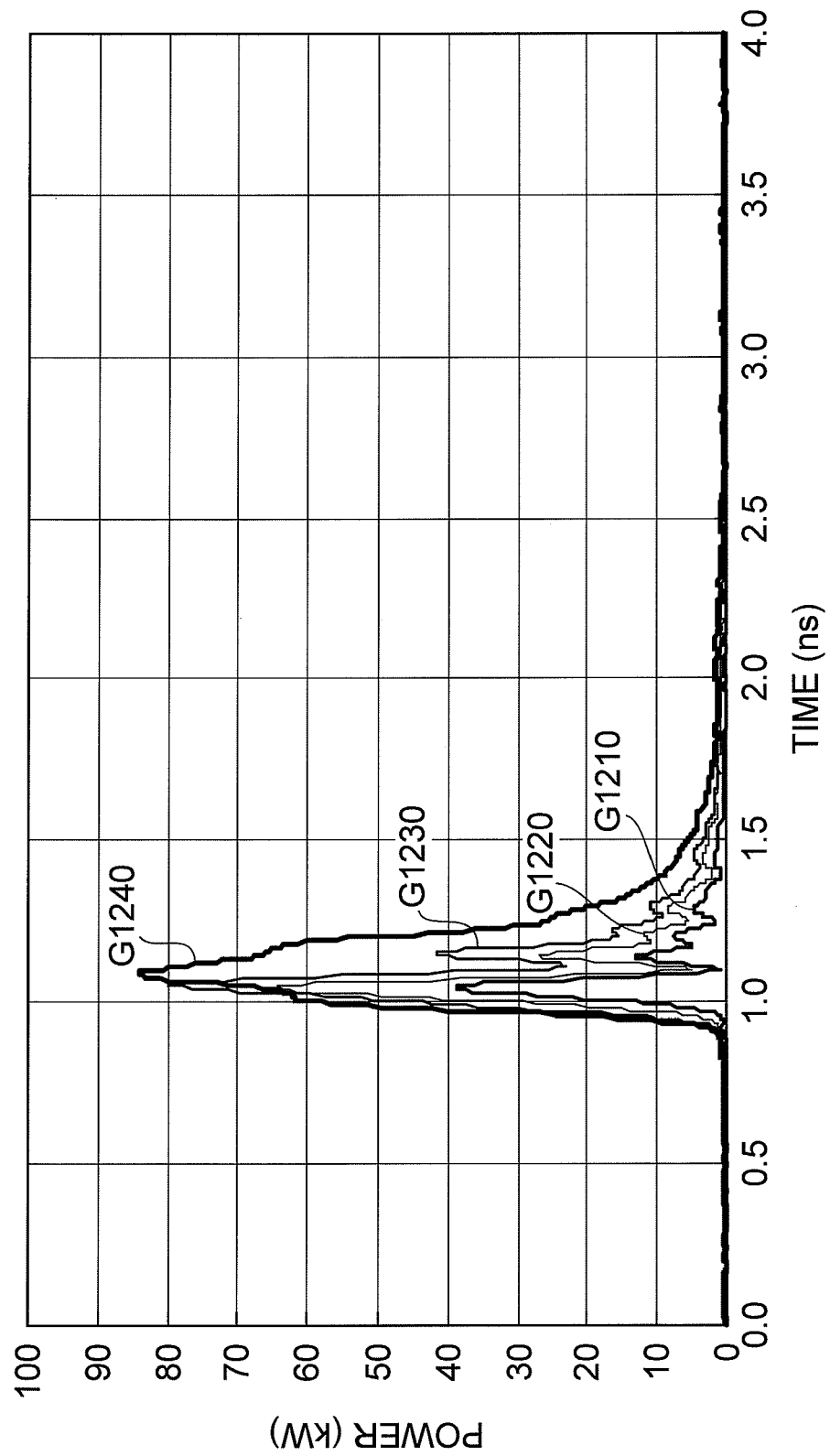
FIG. 12 is a view showing pulse waveforms of output pulsed lights from the pulsed light source in FIG. 1.
Figure 13:
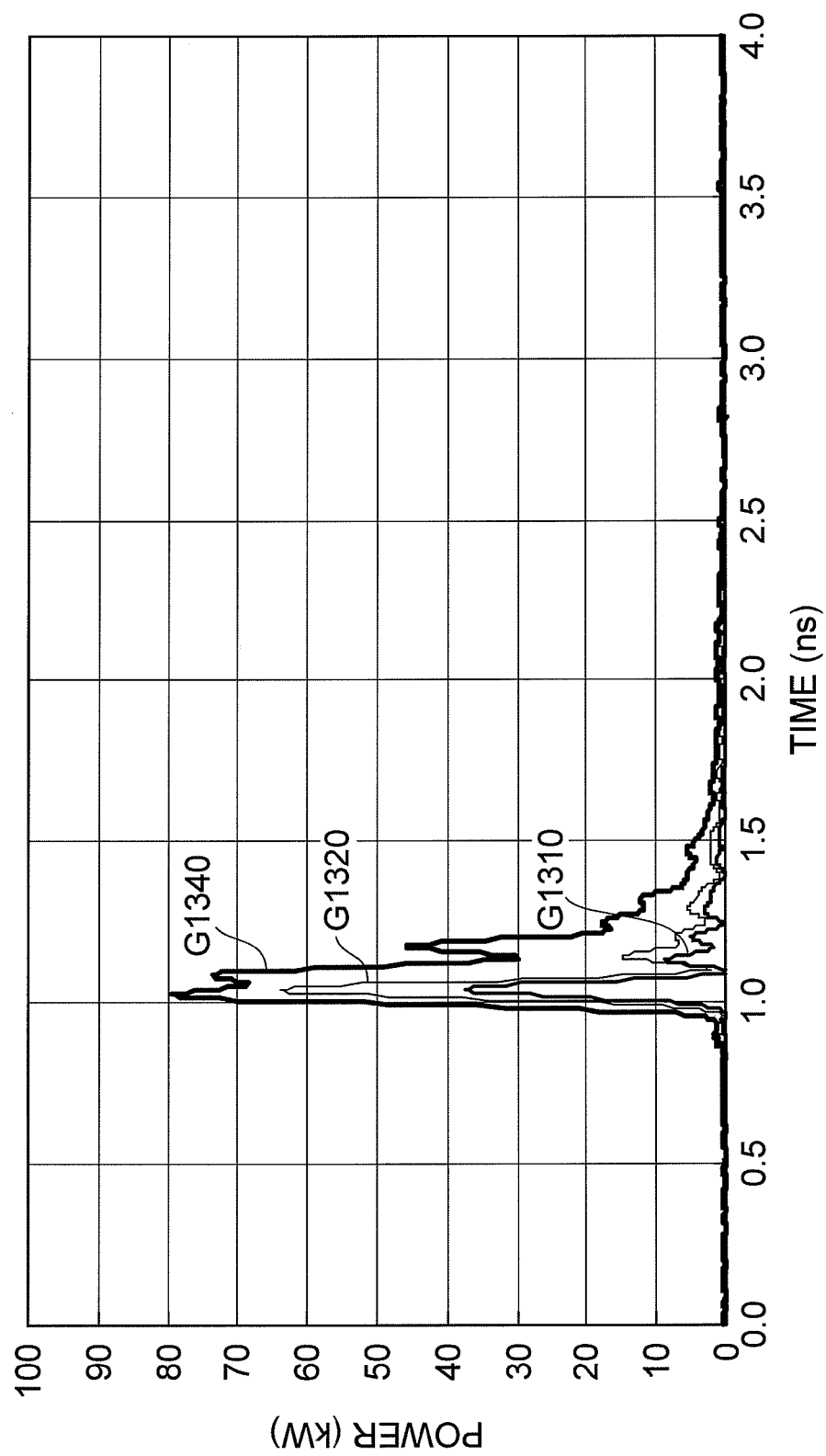
FIG. 13 is a view showing pulse waveforms of output pulsed lights from the pulsed light source in FIG. 1.

FIGS. 10 to 13 show the pulse waveforms of output pulsed lights when the temperature of the seed light source 10 is set to 37° C. FIG. 10 shows pulse waveforms (graphs G1010 to G1040) when the repetition frequency is 100 kHz, FIG. 11 shows pulse waveforms (graphs G1110 to G1140) when the repetition frequency is 300 kHz, FIG. 12 shows pulse waveforms (graphs G1210 to G1240) when the repetition frequency is 600 kHz, and FIG. 13 shows pulse waveforms (graphs G1310, G1320 and G1340) when the repetition frequency is 1000 kHz.

As shown in FIGS. 2 to 13, FWHM (pulse width) generally becomes narrower as the repetition frequency becomes higher, and FWHM also becomes narrower as the pumping power of the YbDF 160 in the fourth stage becomes lower.

Figure 14:
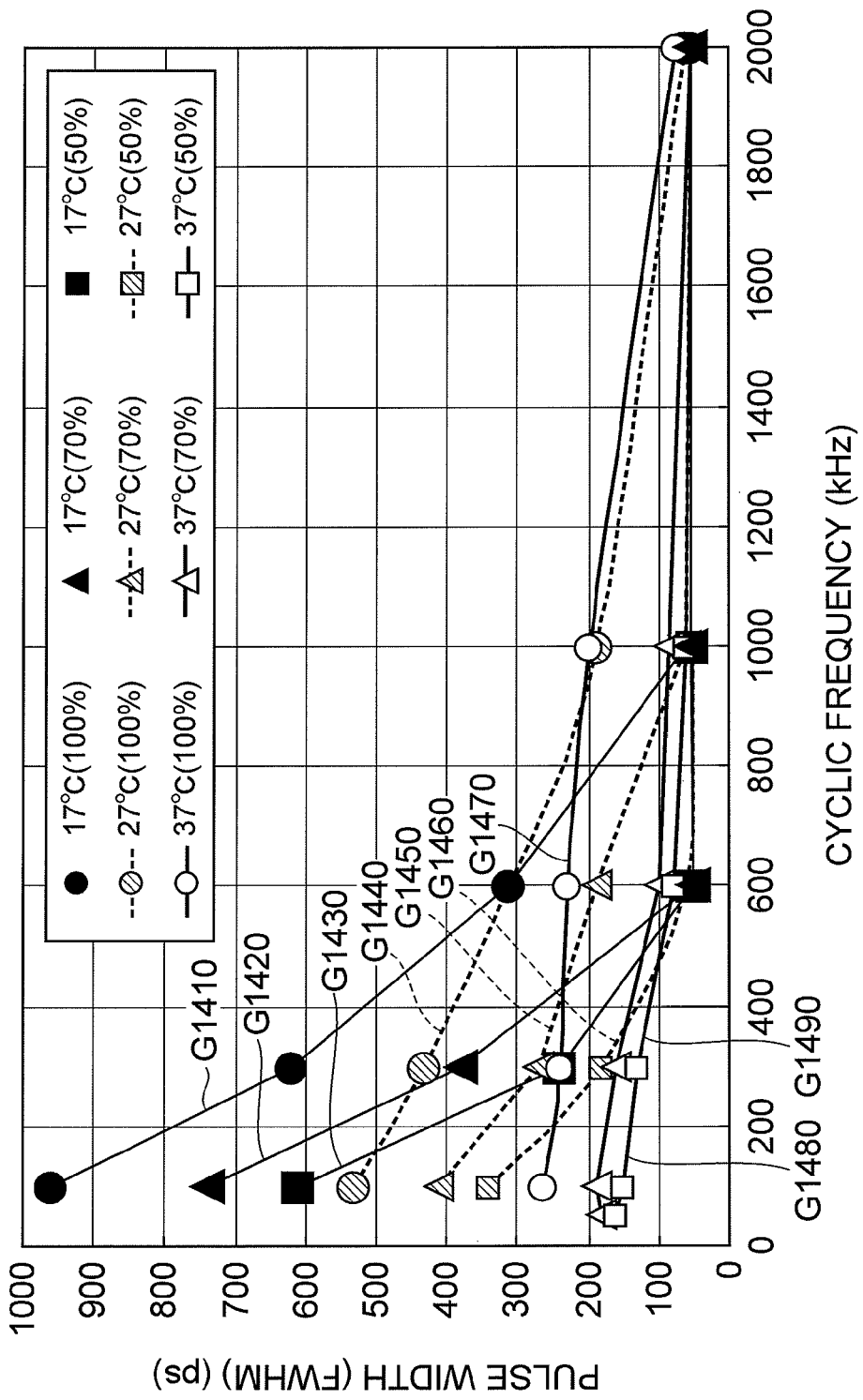
FIG. 14 is a graph showing a relationship between the pulse width (FWHM) of an output pulsed light from the pulsed light source in FIG. 1 and the repetition frequency.

FIG. 14 is a graph showing a relationship between the FWHM of an output pulsed light from the pulse light source 1 and a repetition frequency. In FIG. 14, the graph G1410 shows the relationship when the pumping light power is 100% (temperature of the seed light source 10 is 17° C.), the graph G1420 shows the relationship when the pumping light power is 70% (temperature of the seed light source 10 is 17° C.), and the graph G1430 shows the relationship when the pumping light power is 50% (temperature of the seed light source 10 is 17° C.). The graph G1440 shows the relationship when the pumping light power is 100% (temperature of the seed light source 10 is 27° C.), the graph G1450 shows the relationship when the pumping light power is 70% (temperature of the seed light source 10 is 27° C.), and the graph G1460 shows the relationship when the pumping light power is 50% (temperature of the seed light source 10 is 27° C.). The graph G1470 shows the relationship when the pumping light power is 100% (temperature of the seed light source 10 is 37° C.), the graph G1480 shows the relationship when the pumping light power is 70% (temperature of the seed light source 10 is 37° C.), and the graph G1490 shows the relationship when the pumping light power is 50% (temperature of the seed light source 10 is 37° C.).

Figure 15:
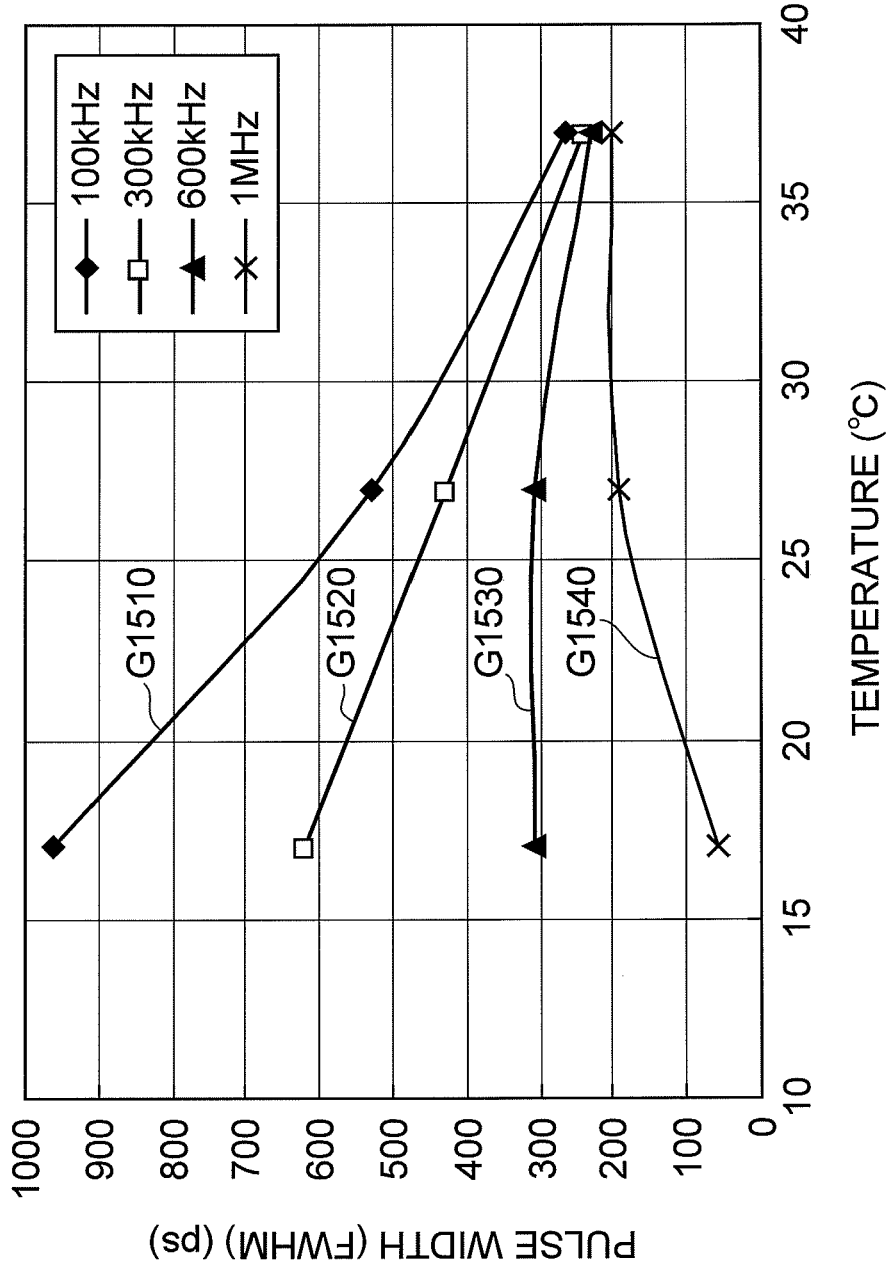
FIG. 15 is a graph showing a relationship between the pulse width (FWHM) of an output pulsed light from the pulsed light source in FIG. 1 and the temperature of a seed light source.
Figure 16:
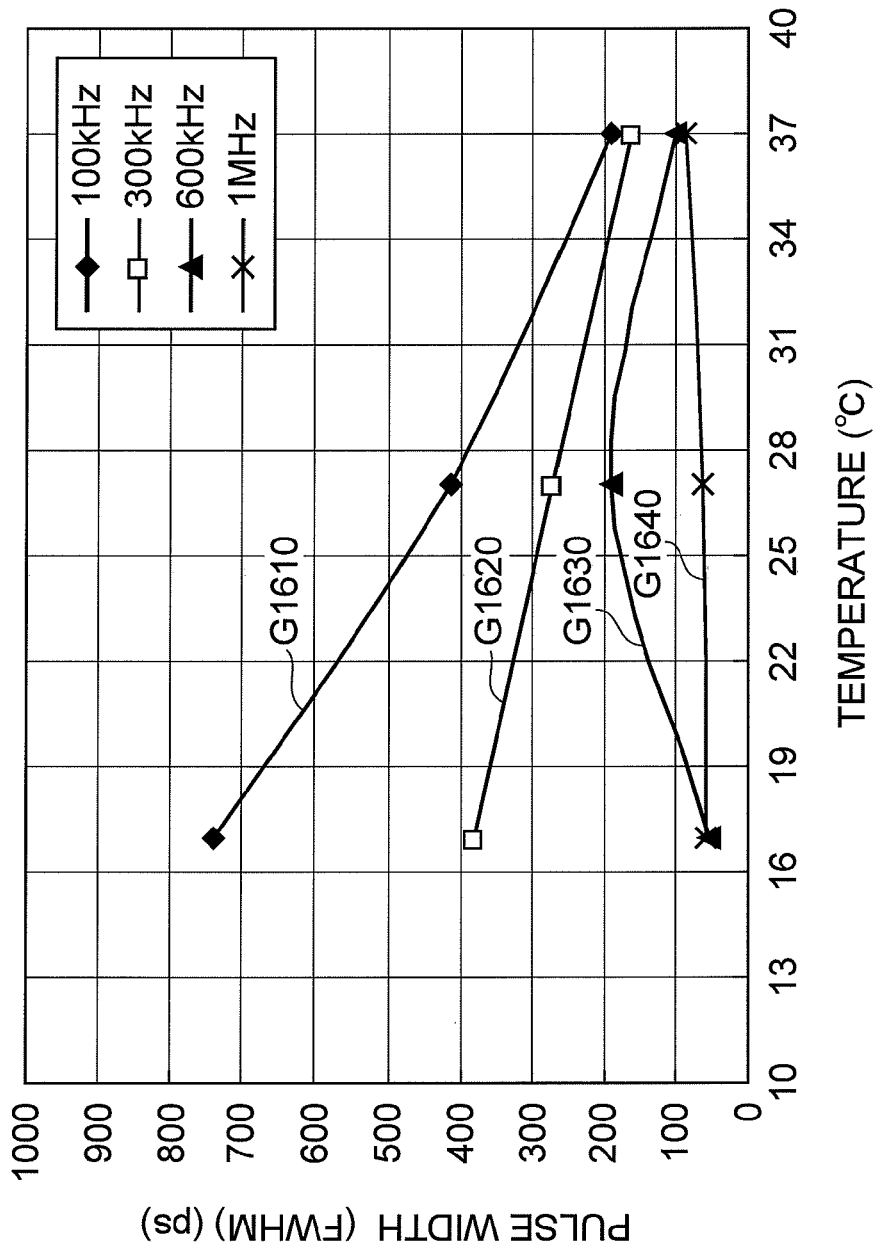
FIG. 16 is a graph showing a relationship between the pulse width (FWHM) of an output pulsed light from the pulsed light source in FIG. 1 and the temperature of a seed light source.

FIGS. 15 and 16 are graphs showing the relationship between the FWHM of an output pulsed light from the pulsed light source 1 and a temperature of the seed light source 10. FIG. 15 shows graphs when the pumping light power of the YbDF 160 in the fourth stage is 100%, and in concrete terms, the graph G1510 shows the relationship when the repetition frequency is 100 kHz, the graph G1520 shows the relationship when the repetition frequency is 300 kHz, the graph G1530 shows the relationship when the repetition frequency is 600 kHz, and the graph G1540 shows the relationship when the repetition frequency is 1 MHz. FIG. 16 shows graphs when the pumping light power of the YbDF 160 in the fourth stage is 70%, and in concrete terms, the graph G1610 shows the relationship when the repetition frequency is 100 kHz, the graph G1620 shows the relationship when the repetition frequency is 300 kHz, the graph G1630 shows the relationship when the repetition frequency is 600 kHz, and the graph G1640 shows the relationship when the repetition frequency is 1 MHz.

At least, the FWHM of the output pulsed light is less than 1 ns, preferably less than 500 ps, and more preferably less than 300 ps, but to make the FWHM of the output pulsed light constant at around 300 ps, for example, the temperature of the seed light source is set to 35.5° C., and the pumping power of the YbDF 160 in the fourth stage is set to 100% if the repetition frequency is 100 kHz, the temperature of the seed light source is set to 34.0° C. and the pumping power of the YbDF 160 in the fourth stage is set to 100% if the repetition frequency is 300 kHz, and the temperature of the seed light source is set to 27.0° C. and the pumping power of the YbDF 160 in the fourth stage is set to 100% if the repetition frequency is 600 kHz. By controlling the temperature of the seed light source 10 like this, the FWHM of the output pulsed light can be maintained at 300 ps in the repetition frequency range 100 kHz to 600 kHz.

In order to maintain the FWHM of the output pulsed light at 200 ps, for example, the temperature of the seed light source 10 is set to 37.0° C. and the pumping power of the YbDF 160 in the fourth stage is set to 70% if the repetition frequency is 100 kHz. The temperature of the seed light source 10 is set to 34.0° C. and the pumping power of the YbDF 160 in the fourth stage is set to 70% if the repetition frequency is 300 kHz. The temperature of the seed light source 10 is set to 27.0° C. and the pumping power of the YbDF 160 in the fourth stage is set to 70% if the repetition frequency is 600 kHz. The temperature of the seed light source is set to 27.0° C. and the pumping power of the YbDF 160 in the fourth stage is set to 100% if the repetition frequency is 1 MHz. By controlling the temperature of the seed light source 10 and the pumping power of the YbDF 160 in the fourth stage like this, the FWHM of the output pulsed light can be maintained at 200 ps in the repetition frequency range 100 kHz to 1 MHz.

However, if the peak value of the output pulsed light is attenuated upon controlling the pumping power of the YbDF 160 in the fourth stage, processing equality is affected. Therefore, it is preferable to control the peak value of the output pulsed light within a region that is saturated due to one or both of a small signal gain of the amplification portion of the optical fiber and the non-linear optical effect in the optical fiber. In the graphs in FIGS. 2 to 13, the range where the pumping power of the YbDF 160 in the fourth stage is 70 to 100% corresponds to this region.

For the above mentioned FWHM control of the output pulsed light, it is preferable to determine the FWHM of the output pulsed light of the pulsed light source 1 in advance by measurement under various conditions (conditions including the repetition frequency, the temperature of the seed light source 10 and the pumping power of the YbDF in the fourth stage), and adjust the temperature of the seed light source 10 and the pumping power of the YbDF in the fourth stage by feed forward control based on this result, so as to implement a predetermined pulse width (FWHM) at a predetermined repetition frequency for the output pulsed light. This control using the feed forward method is ideal to decrease device cost.

Figure 17:
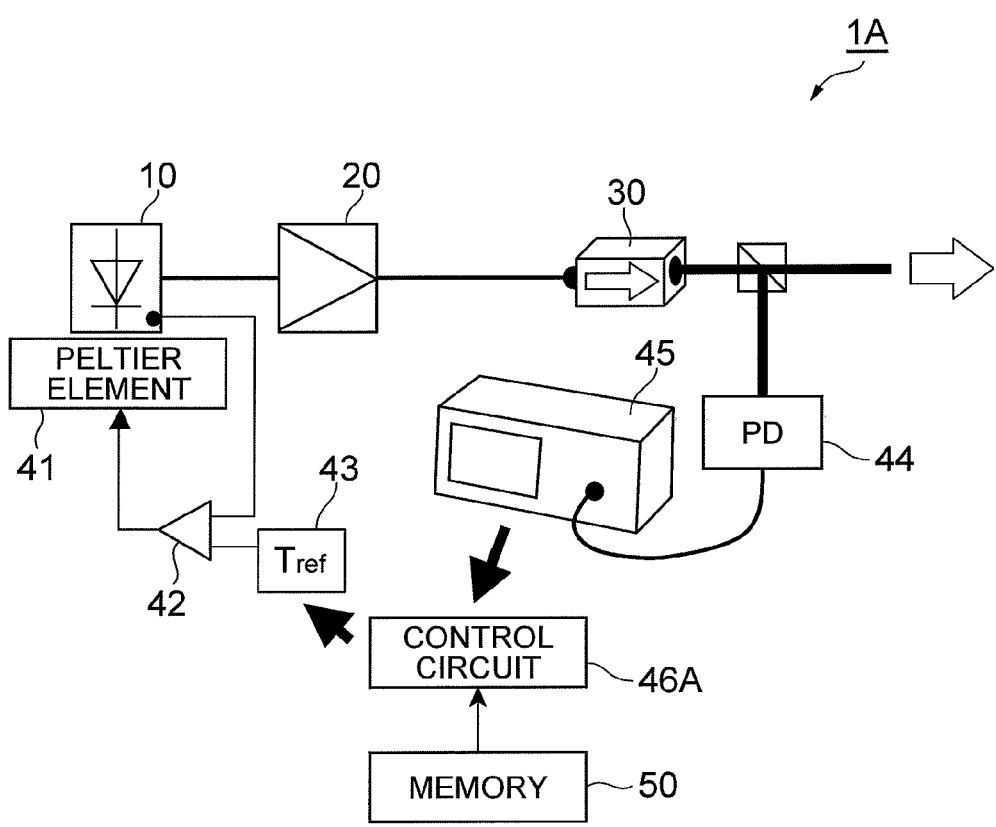
FIG. 17 is a view showing a configuration of another embodiment of the pulsed light source according to the present invention.
Figure 18:
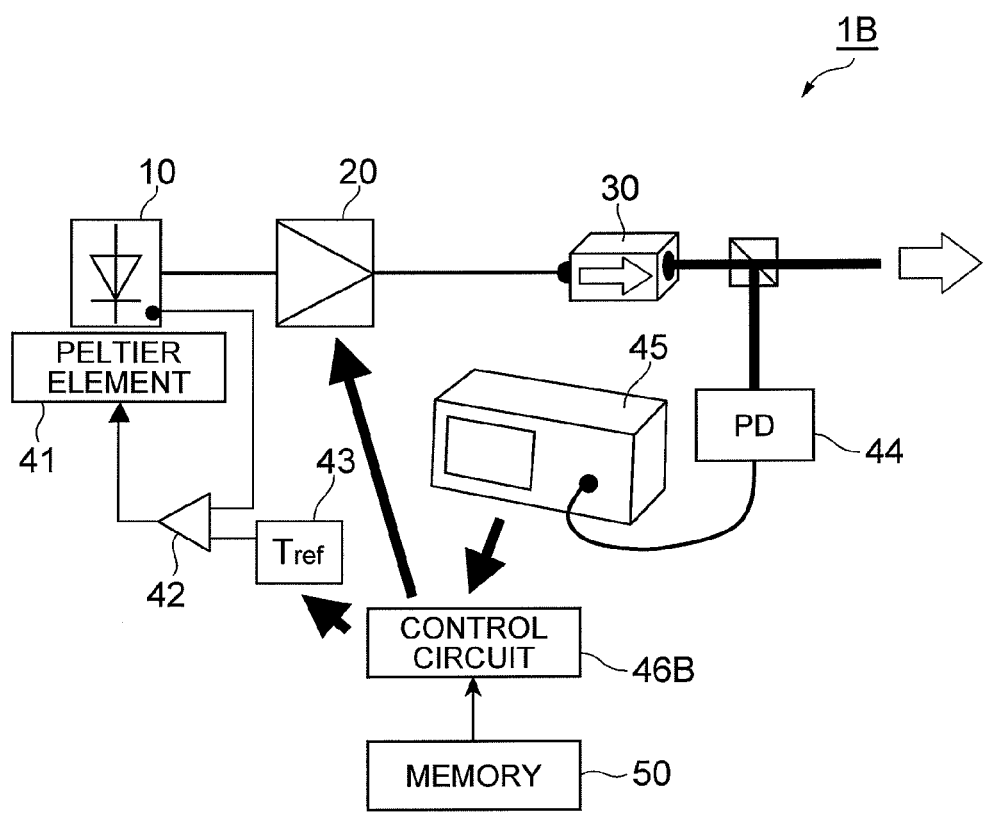
FIG. 18 is a view showing a configuration of still another embodiment of the pulsed light source according to the present invention.

FIGS. 17 and 18 are views showing configurations of other embodiments of the pulsed light source according to the present invention. Pulsed light sources 1A and 1B in FIGS. 17 and 18 are light sources to perform feedback control. Feedback control is advantageous in terms of guaranteeing the stabilization of processing quality. In the case of implementing feed forward control, the configuration for monitoring the output pulsed light (a beam splitter, a PD 44 and a digital oscilloscope 45 disposed downstream from an end cap 30), out of the configurations shown in FIGS. 17 and 18, is unnecessary.

The pulsed light source 1A shown in FIG. 17 adjusts a temperature of the seed light source 10 using a Peltier element 41, and stores a temperature setting value Tref of the seed light source 10 in a memory 50 by a temperature setting unit 43, and controls the Peltier element 41 by an operational amplifier 42 so that the temperature measurement value of the seed light source 10 becomes the temperature setting value Tref. The pulsed light source 1A also splits a part of the pulsed light outputted from the end cap 30, using the beam splitter, and monitors the FWHM of the split light received by the PD 44 using a digital oscilloscope 45. In the case of the feed forward control, measurement values of the FWHM of the output pulsed light of the pulsed light source 1, which are measured in advance under various conditions (conditions including the repetition frequency, the temperature of the seed light source 10 and the pumping power of the YbDF in the fourth stage), are associated with each condition and stored in the form of a table in the memory 50.

In the pulsed light source 1A, a control unit 46A performs the feedback control based on the result of monitoring the FWHM. Based on this feedback control, the pulsed light source 1A adjusts the temperature setting value Tref of the seed light source 10 in the temperature setting unit 43, so as to adjust the temperature of the seed light source 10, and implements a predetermined pulse width (FWHM) at a predetermined repetition frequency for the output pulsed light. If the result of monitoring the FWHM is wider than the predetermined pulse width (FWHM), the temperature of the seed light source 10 is increased, and if the result of monitoring the FWHM is narrower than the predetermined pulse width (FWHM), the temperature of the seed light source 10 is decreased.

The pulsed light source 1B shown in FIG. 18 includes a control unit 46B instead of the control unit 46A. In the pulsed light source 1B, the control unit 46B performs the feedback control based on the result of monitoring the FWHM. Based on this feedback control, the pulsed light source 1B adjusts the temperature setting value Tref of the seed light source 10 in the temperature setting unit 43, so as to adjust the temperature of the seed light source 10, and adjusts the pumping power of the YbDF 160 in the fourth stage, and implements the predetermined pulse width (FWHM) at a predetermined repetition frequency for the output pulsed light.

The following control algorithm is preferable to control the FWHM of the output pulsed light. In other words, as shown in FIG. 19, the temperature of the seed light source 10 is adjusted in a variable range in step S1, and if a desired FWHM of the output pulsed light cannot be implemented in this step, the pumping power of the YbDF 160 in the fourth stage is adjusted in step S2. If the desired FWHM of the output pulsed light is wider than the range of values that can be adjusted in steps S1 and S2, one of the pulse width, the bias level and the amplitude of a modulation signal of the seed light source 10 is adjusted in step S3. It is preferable to perform the temperature adjustment in step S1 under the condition of the repetition frequency of 600 kHz or less. As shown in FIGS. 15 and 16, the dependency of the FWHM of the output pulsed light on the temperature of the seed light source 10 is no longer simple once the repetition frequency exceeds 600 kHz.

If the desired FWHM of the output pulsed light still cannot be implemented after the adjustments in steps S1 to S3, then it is desirable for the control unit to output an alarm (turning an LED ON in the control panel or outputting an error message via control software) regardless whether control is feed forward control or feedback control.

In accordance with the present invention, the dependency of the pulse width (FWHM) of an output pulsed light on the repetition frequency can be ideally decreased.

What is claimed is:
1. A light source control method, comprising steps of:
preparing a pulsed light source which comprises: a semiconductor laser that is directly modulated and outputs pulsed light in a predetermined repetition frequency; an optical filter that inputs the pulsed light outputted from the semiconductor laser and outputs shaped-pulsed light in which one side between either a shorter wavelength side and a longer wavelength side of a wavelength band of the input pulsed light is more attenuated than the other side, the shorter wavelength side and the longer wavelength side being separated at a peak wavelength of the input pulsed light; and an optical fiber amplifier that amplifies the shaped-pulsed light outputted from the optical filter and outputs the amplified-pulsed light, the optical fiber amplifier including a pumping light source that is different from the semiconductor laser and outputs pumping light for amplifying the shaped-pulsed light; and
widening or narrowing a full width half maximum of pulse in the amplified-pulsed light to be outputted from the optical fiber amplifier in the predetermined repetition frequency, by adjusting a temperature of the semiconductor laser and a pumping light power of pumping light source to implement a target full width half maximum of pulse.

2. The light source control method according to claim 1, wherein the target full width half maximum of pulse is less than 1 ns.

3. The light source control method according to claim 2, wherein the target full width half maximum of pulse is less than 500 ps.

4. The light source control method according to claim 3, wherein the target full width half maximum of pulse is less than 300 ps.

5. The light source control method according to claim 1, wherein the predetermined repetition frequency is 600 kHz or less.

6. The light source control method according to claim 1, wherein a relationship among the temperature of the semiconductor laser, the repetition frequency, the pumping light power of the pumping light source, and the full width half maximum of pulse is determined in advance, and the temperature of the first semiconductor laser and the pumping light power of the pumping light source are adjusted by feed-forward control based on this relationship.

7. The light source control method according to claim 1, wherein the full width half maximum of pulse in the amplified-pulsed light outputted from the optical fiber amplifier is monitored, and the temperature of the semiconductor laser and the pumping light power of the pumping light source are adjusted by feedback control based on a result of full width half maximum monitoring.

8. The light source control method according to claim 7, wherein the temperature of the semiconductor laser is increased when the result of full width half maximum monitoring shows that a monitored full width half maximum is wider than the target full width half maximum of pulse, and the temperature of the semiconductor laser is decreased when the result of full width half maximum monitoring shows that a monitored full width half maximum is narrower than the target full width half maximum of pulse.

9. The light source control method according to claim 7, wherein the pumping light power of the pumping light source is decreased when the result of full width half maximum monitoring shows that a monitored full width half maximum is wider than the target full width half maximum of pulse, and the pumping light power of the pumping light source is increased when the result of full width half maximum monitoring shows that a monitored full width half maximum is narrower than the target full width half maximum of pulse.

* * * * *